United States Patent
Killen et al.

(10) Patent No.: US 6,794,952 B2
(45) Date of Patent: Sep. 21, 2004

(54) HIGH EFFICIENCY LOW PASS FILTER (75) Inventors: William D. Killen, Melbourne, FL (US); Randy T. Pike, Grant, FL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 10/185,187

(22) Filed: Jun. 27, 2002

(65) Prior Publication Data

US 2004/0000960 A1 Jan. 1, 2004

(51) Int. Cl.$^7$ .............................. H01P 5/00; H01P 1/203
(52) U.S. Cl. ........................................ 333/33; 333/204
(58) Field of Search ............................ 333/33, 202, 204

(56) References Cited

U.S. PATENT DOCUMENTS

| | | |
|---|---|---|
| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |
| 4,638,271 A | 1/1987 | Jecko et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |
| 5,379,006 A | 1/1995 | McCorkle |
| 5,455,545 A | 10/1995 | Garcia |
| 5,523,728 A | 6/1996 | McCorkle |
| 5,678,219 A | 10/1997 | Agarwal et al. |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

FOREIGN PATENT DOCUMENTS

| | | |
|---|---|---|
| JP | 03 173201 | 7/1991 |
| JP | 05 211402 | 8/1993 |
| JP | 08 154006 | 6/1996 |
| JP | 2000 307362 | 11/2000 |

OTHER PUBLICATIONS

U.S. patent application Ser. No. 10/448,973, Delgado et al., filed May 30, 2003.

U.S. patent application Ser. No. 10/184,277, Killen et al., filed Jun. 27, 2002.

(List continued on next page.)

Primary Examiner—Don Le
(74) Attorney, Agent, or Firm—Sacco & Associates, PA (57) ABSTRACT A printed circuit (100) for processing radio frequency signals includes a substrate (110) including substrate regions (101, 103, 105, 111, and 119) upon which the printed circuit can be placed. The circuit is a lowpass filter including a transformer line section (112), at least a first stub section (114 or 116), and transmission line sections (117) interconnecting the transformer line section with at least the first stub section. The transformer line section, the transmission line sections, and at least the first stub section are coupled to respective substrate regions that have substrate characteristics that are each independently customizable. The circuit further comprises at least one ground or ground plane (120) coupled to the substrate.

22 Claims, 4 Drawing Sheets

OTHER PUBLICATIONS

U.S. patent application Ser. No. 10/185,443, Killen et al., filed Jun. 27, 2002.
U.S. patent application Ser. No. 10/184,332, Killen et al., filed Jun. 27, 2002.
U.S. patent application Ser. No. 10/185,251, Parsche et al., filed Jun. 27, 2002.
U.S. patent application Ser. No. 10/185,847, Killen et al., filed Jun. 27, 2002.
U.S. patent application Ser. No. 10/185,275, Killen et al., filed Jun. 27, 2002.
U.S. patent application Ser. No. 10/185,273, Killen et al., filed Jun. 27, 2002.
U.S. patent application Ser. No. 10/308,500, Killen et al., filed Dec. 3, 2002.
U.S. patent application Ser. No. 10/373,935, Killen et al., filed Feb. 25, 2003.
U.S. patent application Ser. No. 10/404,285, Killen et al., filed Mar. 31, 2003.
U.S. patent application Ser. No. 10/404,981, Killen et al., filed Mar. 31, 2003.
U.S. patent application Ser. No. 10/404,960, Killen et al., filed Mar. 31, 2003.
U.S. patent application Ser. No. 10/185,144, Killen et al., filed Jun. 27, 2002.
U.S. patent application Ser. No. 10/185,266, Killen et al., filed Jun. 27, 2002.
U.S. patent application Ser. No. 10/185,162, Rumpf, Jr. et al., filed Jun. 27, 2002.
U.S. patent application Ser. No. 10/185,824, Killen et al., filed Jun. 27, 2002.
U.S. patent application Ser. No. 10/185,855, Killen et al., filed Jun. 27, 2002.
U.S. patent application Ser. No. 10/185,459, Killen et al., filed Jun. 27, 2002.
U.S. patent application Ser. No. 10/185,480, Killen et al., filed Jun. 27, 2002.
U.S. patent application Ser. No. 10/439,094, Delgado et al., filed May 15, 2003.

HIGH EFFICIENCY LOW PASS FILTER

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance in two port resonant lines.

2. Description of the Related Art

RF circuits, transmission lines and antenna elements are commonly manufactured on specially designed substrate boards. For the purposes of these types of circuits, it is important to maintain careful control over impedance characteristics and electrical length. If the impedances of different parts of the circuit do not match, this mismatch can result in inefficient power transfer, unnecessary heating of components, and other problems. Electrical length transmission lines and radiators in these circuits can also be a critical design factor.

Two critical factors affecting the performance of a substrate material are permittivity (sometimes called the relative permittivity or $\epsilon_r$) and the loss tangent (sometimes referred to as the dissipation factor). Another critical factor is the permeability (sometimes called the relative permeability or $\mu_r$). The relative permittivity and relative permeability determine the speed of the signal, and therefore the electrical length of transmission lines and other components implemented on the substrate. The loss tangent characterizes the amount of loss that occurs for signals traversing the substrate material. Accordingly, low loss materials become even more important with increasing frequency, particularly when designing receiver front ends and low noise amplifier circuits.

Printed transmission lines, passive circuits and radiating elements used in RF circuits can be formed in many different ways. Three common implementations are described below. One configuration known as microstrip, places the signal line on a board surface and provides a second conductive layer, commonly referred to as a ground plane. A second type of configuration known as buried microstrip is similar except that the signal line is covered with a dielectric superstrate material. In a third configuration known as stripline, the signal line is sandwiched between two electrically conductive (ground) planes. Ignoring loss, the characteristic impedance of a standard transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the physical geometry and spacing of the line structure as well as the permittivity and permeability of the substrate material(s) used to separate the transmission line structures. Conventional substrate materials typically have a relative permeability of approximately 1.0.

In conventional RF design, a substrate material is selected that has a relative permittivity value suitable for the design and the relative permeability typically approximately 1 for most common dielectric substrate materials. Once the substrate material is selected, the line characteristic impedance value is exclusively adjusted by controlling the line geometry and physical structure.

Radio frequency (RF) circuits are typically embodied in hybrid circuits in which a plurality of active and passive circuit components are mounted and connected together on a surface of an electrically insulating board substrate such as a ceramic substrate. The various components are generally interconnected by printed metallic conductors of copper, gold, or tantalum, for example that are transmission lines as stripline or microstrip or twin-line structures.

The permittivity and permeability of the chosen substrate material for a transmission line, passive RF device, or radiating element determines the physical wavelength of RF energy at a given frequency for that line structure. One problem encountered when designing microelectronic RF circuitry is the selection of a board substrate material that is optimized for all of the various passive components, and transmission line circuits to be formed on the board. In particular, the geometry of certain circuit elements may be physically large or miniaturized due to the unique electrical or impedance characteristics required for such elements. For example, many circuit elements or tuned circuits may need to be an electrical ¼ wave. Similarly, the line widths required for exceptionally high or low characteristic impedance values can, in many instances, be too narrow or too wide respectively for practical implementation for a given substrate. Since the physical size of the microstrip or stripline is inversely related to the relative permittivity and permeability of the substrate material, the dimensions of a transmission line can be affected greatly by the choice of substrate board material.

Still, an optimal board substrate material design choice for some components may be inconsistent with the optimal board substrate material for other components, such as antenna elements or filters. Moreover, some design objectives for a circuit component may be inconsistent with one another. Accordingly, the constraints of a circuit board substrate having selected relative dielectric properties often results in design compromises that can negatively affect the electrical performance and/or physical characteristics of the overall circuit.

An inherent problem with the foregoing approach is that, at least with respect to the substrate material, the only control variable for line impedance is the relative permittivity, $\epsilon_r$. Changes in the relative permittivity affect $C_l$, the capacitance per unit length. This limitation highlights an important problem with conventional substrate materials, i.e. they fail to take advantage of the other material factor that determines characteristic impedance, namely the relative permeability, $\mu_r$. Changes in the relative permeability affect $L_l$, the inductance per unit length of the transmission line.

Yet another problem that is encountered in RF circuit design is the optimization of circuit components for operation on different RF frequency bands. Line impedances and lengths that are optimized for a first RF frequency band may provide inferior performance when used for other bands, either due to impedance variations and/or variations in electrical length. Such limitations can reduce the effective operational frequency range for a given RF system.

Conventional circuit board substrates are generally formed by processes such as casting or spray coating which generally result in uniform substrate physical properties, including the permittivity. Accordingly, conventional dielectric substrate arrangements for RF circuits have proven to be a limitation in designing circuits that are optimal in regards to both electrical and physical size characteristics.

SUMMARY OF THE INVENTION

In a first embodiment according to the invention, a circuit for processing radio frequency signals comprises a substrate where the circuit can be placed. The substrate includes at least one substrate layer having a first set of substrate properties over a first region and at least a second set of substrate properties over a second region. The second set of substrate properties is different than the first set of substrate properties. The circuit further comprises at least one ground coupled to the substrate and a two port resonant line, at least a portion of said two port resonant line coupled to said second region.

In a second embodiment according to the invention, a printed circuit for processing radio frequency signals comprises a substrate upon which the circuit can be placed. The substrate includes at least one substrate layer having a first set of substrate properties over a first region and at least a second set of substrate properties over a second region. The second set of substrate properties provides a different dielectric permittivity and magnetic permeability as compared to the first set of dielectric properties. The printed circuit further comprises at least one ground disposed in or on said substrate and a lowpass filter. The lowpass filter includes a transformer line section on or within at least a portion of the first region and on or within at least a portion of the second region and at least a first stub section on or within the first region and on or within at least a portion of the second region. It should be understood within contemplation of the scope of the claims that "on" may be also mean "in" or "within" in certain contexts. For example, a ground "on" the substrate or a transformer line "on" a first region should be understood to mean "on or in or within" the substrate or first region respectively.

In a third embodiment of the present invention, a printed circuit for processing radio frequency signals comprises a substrate including substrate regions upon which the printed circuit can be placed. The circuit is a lowpass filter including a transformer line section, at least a first stub section, and transmission line sections interconnecting the transformer line section with at least the first stub section. The transformer line section, the transmission line sections, and at least the first stub section are coupled to respective substrate regions that have substrate characteristics that are each independently customizable. The circuit further comprises at least one ground coupled to the substrate.

DETAILED DESCRIPTION OF THE PREFERRED EMBODIMENTS

Figure 1:
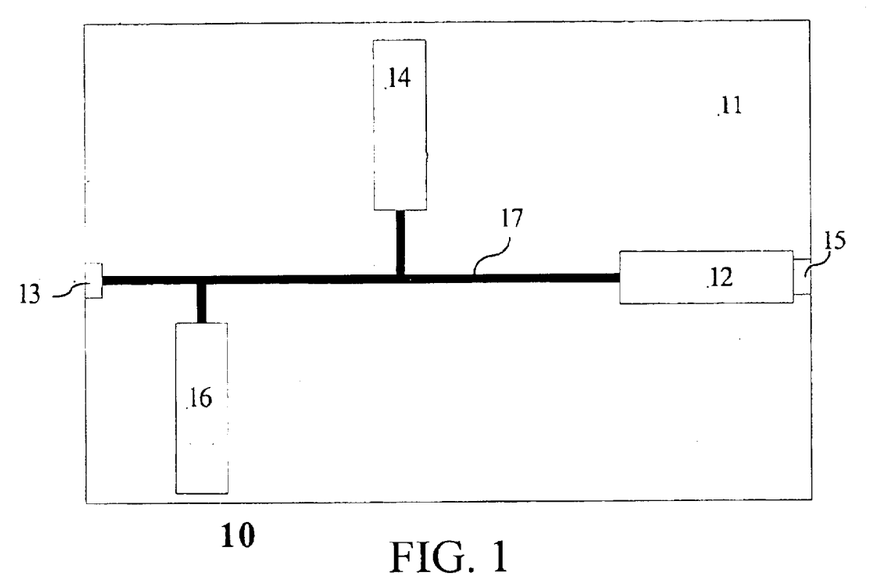
FIG. 1 is a top view of a two port line formed on a conventional substrate.

Referring to FIG. 1, a conventional two port line 10 is shown on a printed circuit board substrate 11 having ports 13 and 15 coupled to transmission line section 17 and to a transformer line section 12. Additionally, the two port filter line 10 further includes stub line sections 14 and 16. The transmission line section 17 has a first impedance while the stub line sections 14 can have at least a second impedance. In this instance the impedance characteristics of the two port line is dependant on the impedance characteristics or the effective permeability and permittivity of the substrate 11. Design choices on the size of the transformer line section and stub line sections are dictated by such impedance characteristics.

The transformer is generally used to compensate for a mismatch in impedance between two points on a transmission line. In a quarter-wave transformer, a load impedance $Z_L$ to the characteristic feedline impedance $Z_0$ through a short length of transmission line of length l has an impedance of $Z_t$. For a perfect transition with no reflections at the interface between a microstrip and a load, the characteristic impedance would $Z_t$ would equal:

$$Z_t = \sqrt{Z0 * Zl}$$

Therefore, the transformer line section is typically designed to match the characteristic feedline impedance with the load impedance (not shown).

Figure 2:
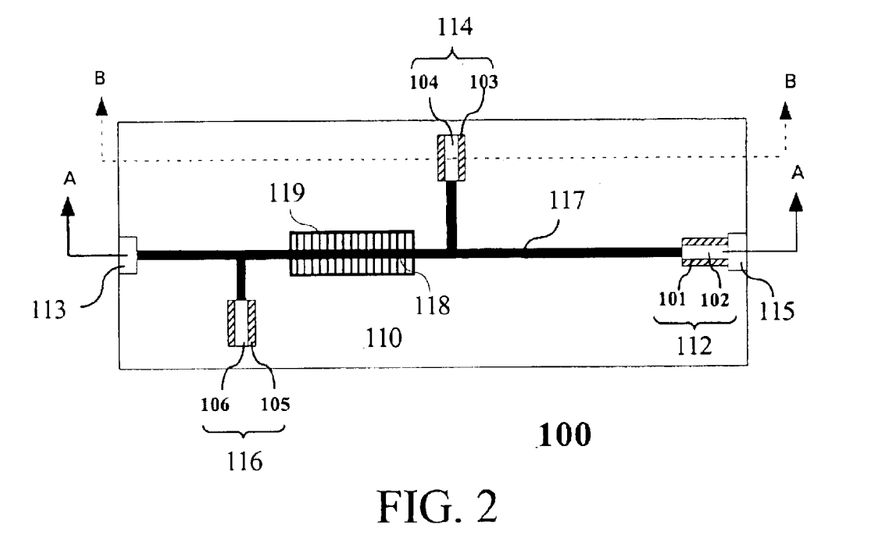
FIG. 2 is a top view of a two port line formed on a substrate for reducing the size of the two port line in accordance with the present invention.

Referring to FIG. 2, two port line 100 serving as a low pass filter is mounted on layer of substrate material (substrate layer) 110. In FIG. 2, the two port line 100 is configured as having an input port 113 at a proximal end and an output port 115 at a distal end, a transformer section 112, one or more stub sections (114 and 116), and a transmission line or trace 117 extending from the proximal end to the transformer section 112, wherein the stub sections extend from the trace 117 to a respective end of the stub. The stubs 114 and 116 and the transformer section 112 can be wider but shorter then the trace 117. It will be appreciated by those skilled in the art, however, that the invention is not so limited and the two port line also can be configured in differing shapes. For example, in one arrangement the two port line can have a constant width trace without a stub, can have a trace having an expanding or tapered width, or can have a circular or radial stub. Still, other line shapes can be utilized.

The stubs 114 and 116 can be viewed as resonant lines. A resonant line is a transmission line typically used in radio frequency (RF) circuits. A resonant line has finite length and is not terminated in its characteristic impedance ($Z_0$). The mismatch between $Z_0$ and the impedance at the termination (load impedance, $Z_L$) causes energy reflections to occur at certain frequencies. These energy reflections can increase or decrease a voltage on the line, depending on the frequency of the applied voltage and the position on the line where the voltage is being measured. Accordingly, at some frequencies a resonant line of a given length may have high input impedance, similar to a parallel resonant circuit at resonance, while at other frequencies the resonant line may have low input impedance, similar to a series resonant circuit at resonance. At other frequencies the resonant line may also have complex or reactive impedances. As a low-pass filter, the present invention enables a deeper rejection in a bandstop area of a filter response and a lower loss in a bandpass area of the filter response than previous designs using standard materials.

On printed circuit boards or substrates, single port resonant lines are typically implemented by creating a line with a single port at the input and either open-circuited or short-circuited to ground at the termination. The electrical length of a single port resonant line is usually some multiple of a quarter of an electrical wavelength of a selected frequency. On a short-circuited line, each point at an odd number of quarter-wavelengths from the termination has high impedance and relative voltage maxima, and each point at an even number of quarter-wavelengths from the termination has a low impedance and a relative voltage minima. The positions of voltage maxima and minima are reversed on an open-circuited resonant line. The input impedance to a single port resonant line is typically resistive when the length of the resonant line is an even or odd multiple of the quarter-wavelength of the operational frequency. That is, the input to the single port resonant line is at a position of voltage maxima or minima.

When the input to the single port resonant line is at a position between the voltage maxima and minima points, the input impedance can have reactive components, which can useful. For example, resonant lines may also act as nearly pure capacitances or inductances. For example, an open-circuited line acts as a pure capacitance at ⅛ wavelength long, acts as a series LC impedance at ¼ wavelength long, acts a pure inductance at ⅜ wavelengths long, and acts like a parallel LC circuit at ½ wavelength long. This cycle repeats every half wavelength with smooth transitions between each of the above mentioned points. Thus, properly chosen single port resonant line segments may be used as parallel-resonant, series-resonant, inductive, or capacitive circuits.

A short-circuited line acts as a pure inductance at ⅛ wavelength long, acts as a parallel LC impedance at ¼ wavelength long, acts a pure capacitance at ⅜ wavelengths long, and acts like a series LC circuit at ½ wavelength long. This cycle repeats every half wavelength with smooth transitions between each of the above mentioned points. Thus, properly chosen single port resonant line segments may be used as parallel-resonant, series-resonant, inductive, or capacitive circuits.

When a resonant line is terminated in capacitance, the capacitor does not absorb energy, but returns all of the energy to the circuit. The impedance discontinuity between the line impedance and the termination produce a reflected wave that adds to the incident wave to produce a standing wave. The voltage of the standing wave is a minimum at a distance of exactly ⅛ wavelength from the end if the termination when the termination capacitive reactance has the same absolute value as $Z_0$. If the capacitive reactance is greater than $Z_0$ (smaller capacitance), the termination looks more like an open circuit and the voltage minimum moves away from the end. If the capacitive reactance is smaller than $Z_0$, the voltage minimum moves closer to the end.

Single port resonant lines are commonly manufactured on specially designed printed circuit boards. The resonant lines can be formed many different ways. Three common implementations are described below. One configuration known as microstrip places the resonant line on a board surface and provides a second conductive layer coupled to the board. This second conductive layer is commonly referred to as a ground plane. A second type of configuration known as buried microstrip is similar except that the resonant line is covered with a dielectric substrate material. In a third configuration known as stripline, the resonant line is sandwiched between two electrically conductive (ground) planes, which can be proximate to the board or coupled to the board. As defined herein, coupled to the board means attached to the surface of the board or contained within the board.

Low permittivity printed circuit board materials are ordinarily selected for RF circuit designs. For example, polytetrafluoroethylene (PTFE) based composites such as RT/Duroid® 6002 (relative permittivity of 2.94; loss tangent of 0.009) and RT/Duroid® 5880 (relative permittvity of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low permittivity with accompanying low loss tangents.

However, use of conventional board materials can compromise the miniaturization of circuit elements and may also compromise some performance aspects of circuits that can benefit from high dielectric constant layers. By comparison, the present invention provides the circuit designer with an added level of flexibility by permitting use of locally high permittivity substrate layer portions and locally low permittivity substrate layer portions. In addition, localized board portions can be optimized for efficiency through the ability to select localized magnetic permeability substrate properties. This added flexibility enables improved performance and line element density not otherwise possible.

Dielectric substrate boards having metamaterial portions providing localized and selectable magnetic and dielectric properties can be prepared in the following manner. As defined herein, the term "metamaterials" refers to composite materials formed from the mixing or arrangement of two or more different materials at a very fine level, such as the Angstrom or nanometer level. Metamaterials allow tailoring of electromagnetic properties of the composite, which can be defined by effective electromagnetic parameters comprising effective electrical permittivity $\in_{\mathit{eff}}$ (or dielectric constant) and the effective magnetic permeability $\mu_{\mathit{eff}}$.

Appropriate bulk dielectric ceramic substrate materials can be obtained from commercial materials manufacturers, such as DuPont and Ferro. The unprocessed material, commonly called Green Tape™, can be cut into sized portions from a bulk dielectric tape, such as into 6 inch by 6 inch portions. For example, DuPont Microcircuit Materials provides Green Tape material systems, such as 951 Low-Temperature Cofire Dielectric Tape and Ferro Electronic Materials ULF28–30 Ultra Low Fire COG dielectric formulation. These substrate materials can be used to provide dielectric layers having relatively moderate dielectric constants with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying portions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include metamaterials. The choice of a metamaterial composition can provide controllable effective dielectric constants over a relatively continuous range from less than 2 to at least 2650. Controllable magnetic permeability properties are also available from certain metamaterials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a substrate layer that result in at least one of the dielectric and magnetic properties being different at one portion of the substrate as compared to another portion. A differentially modified board substrate preferably includes one or more metamaterial containing regions.

For example, the modification can be selective modification where certain substrate layer portions are modified to produce a first set of dielectric permittivity or magnetic permeability properties, while other susbstrate layer portions are modified differentially or left unmodified to provide dielectric and/or magnetic properties different from the first set of properties. Differential modification can be accomplished in a variety of different ways.

According to one embodiment, a supplemental substrate layer can be added to the existing substrate layer. Techniques known in the art such as various spray technologies, spin-on technologies, various deposition technologies or sputtering can be used to apply the supplemental susbstrate layer. The supplemental substrate layer can be selectively added in localized regions, including inside voids or holes, or over the entire existing substrate layer. For example, a supplemental substrate layer can be used for providing a substrate portion having an increased effective permittivity.

Responses of a substrate layer to a given energetic stimuli may be substantially permanent in whole or in part. Permanent responses permit one time application of an appropriate stimulus to achieve one or more desired physical substrate layer properties. Physical properties may also be dynamically controlled, such as through the use of discharge electrodes which can permit application of a time-varying electrical field across the substrate layer. Dynamic control of the substrate layer properties, such as the permittivity, can be used to control the susbstrate layer physical characteristics to optimize the performance of the resonant line in response to varying signal characteristics, for example a substantial change in operating frequency.

The differential modifying step can further include locally adding additional material to the substrate layer or supplemental substrate layer. The addition of material can be used to further control the effective permittivity or permeability properties of the susbstrate layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanometer size particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic metamaterial particles that are generally suitable for controlling magnetic permeability properties of the substrate layer for a variety of applications described herein include ferrite organoceramics (FexCyHz)-(Ca/Sr/Ba-Ceramic). These particles work well for applications in the frequency range of 8–40 GHz. Alternatively, or in addition thereto, niobium organoceramics (NbCyHz)-(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer (e.g. LCP) matrix or side chain moiety. In addition to controlling the magnetic permeability properties of the substrate, the added particles can also be used to control the effective permittivity of the material. Using a fill ratio of composite particles from approximately 1 to 70%, it is possible to raise and possibly lower the permittivity of substrate layer and/or supplemental susbstrate layer portions significantly. For example, adding organofunctionalized nanoparticles to a substrate layer can be used to raise the permittivity of the modified dielectric layer portions.

Particles can be applied by a variety of techniques including polyblending, mixing and filling with agitation. For example, if the substrate layer includes a LCP, the permittivity may be raised from a nominal LCP value of 2 to as high as 10 by using a variety of particles with a fill ratio of up to about 70%.

Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable substrate properties can be localized to areas as small as about 10 nanometers, or cover large area regions, including the entire board substrate surface. Conventional techniques such as lithography and etching along with deposition processing can be used for localized permittivity and permability manipulation.

Materials can be prepared mixed with other materials or by including varying densities of voided regions (which generally introduce air) to produce effective relative permittvities in a substantially continuous range from 2 to at least 2650, as well as other potentially desired substrate properties. For example, materials exhibiting a relative permittivity (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. % to render these or any other material significantly magnetic. For example, magnetic properties may be tailored with organofunctionality. The impact on dielectric constant from adding magnetic materials generally results in an increase in the dielectric constant.

Medium dielectric constant materials have a relative permeability generally in the range of 70 to 500+/−10%. As noted above these materials may be mixed with other materials or voids to provide desired effective relative permittivity values. These materials can include ferrite doped calcium titanate. Doping metals can include magnesium, strontium and niobium. These materials have a range of 45 to 600 in relative magnetic permeability.

For high permittivity applications, ferrite or niobium doped calcium or barium titanate zirconates can be used. These materials have a relative permittivity of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organo functional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including metamaterials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate portion.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, substrate materials can be provided with localized tunable dielectric and/or magnetic characteristics for improving the density and performance of circuits including those having two port lines serving as elliptic or other such lowpass filters. The substrate flexibility allows independent optimization of the line impedance of the various elements comprising the two port line.

However, use of conventional board materials can compromise the miniaturization of circuit elements and may also compromise some performance aspects of circuits that can benefit from high dielectric constant layers. A typical tradeoff in a communications circuit is between the physical size of a resonant line versus operational frequency. By comparison, the present invention provides the circuit designer with an added level of flexibility by permitting use of a high dielectric constant substrate layer portion with magnetic properties optimized for reducing the size of a resonant line and/or transformer line for operation at a specific frequency. Further, the present invention also provides the circuit designer with means for controlling the quality factor (Q) of the resonant line aspects of the two port line. This added flexibility enables improved performance and resonant line density and performance not otherwise possible for radio frequency circuits (RF) constructed using standard techniques and materials. As defined herein, radio frequency means any frequency that can be used to propagate an electromagnetic wave.

Figure 3:
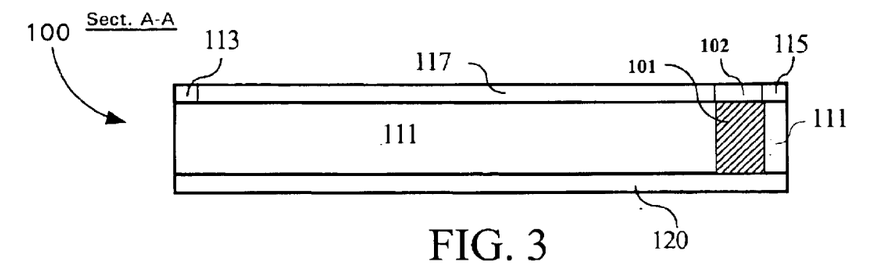
FIG. 3 is a cross-sectional view of the two port line of FIG. 2 taken along line A—A.

Referring to FIGS. 2 & 3, the two port line 100 is mounted on a substrate (dielectric layer) 110 that includes at least a first region 111 having a first set of substrate properties (such as dielectric permittvity and magnetic permeability properties) including a relative permittivity and relative permeability, and at least a second region 101 having a second set of substrate properties including a second relative permittivity and relative permeability constant. The first relative permittivity is preferably different from the second relative permittivity. In this instance, the second region 101 can lie under the transformer section 112. Transformer line section 112 and the second region 101 of the substrate layer 110 are configured so that at least a portion of a trace portion 102 of the transformer line section 112 is positioned on the second region 101 as shown. As shown the second region 101 occupies a wider area than the trace portion 102 of the transformer line section 112, but the present invention is not limited thereto. Likewise, but independent of the transformer line section (and of each other, if desired), the stubs 114 and 116 are configured so at least a portion of their respective trace portions 104 and 106 have their respective "second" regions 103 and 105 with their own substrate properties. The present invention contemplates that each of the "second" regions 101, 103 and 105 can have their own substrate properties, but a circuit designer could also have these "second" regions match as well.

Figure 6:
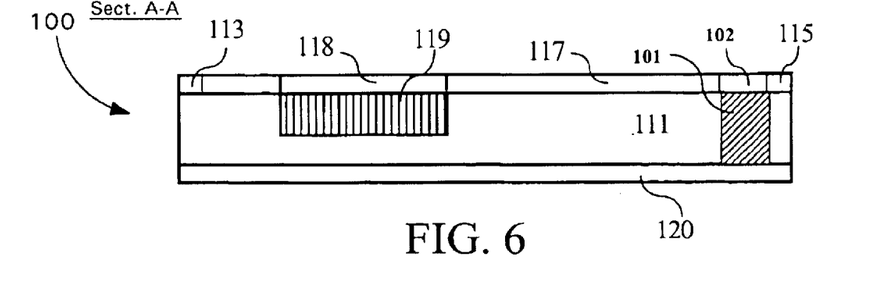
FIG. 6 is a cross-sectional view of an alternate embodiment of the two port line of FIG. 2 taken along line A—A where a portion of the transmission line includes a customized substrate region.

Optionally, a portion 118 of the transmission line or trace 117 can also have its own region or "second" region with its own substrate properties. This would allow a designer to lengthen or shorten (or fatten) as desired the interconnecting traces between the elements included in the exemplary two port line shown in FIG. 2 and the cross-sectional view of FIG. 6. It should be understood within contemplation of the invention that the entire trace 117 can have its own region with its own substrate properties that are different from regions 101, 103 and 111.

The relative permittivity of the second region (101 or 103 or 105) can be higher than the first region 111. Accordingly, the size of the stubs 114 and 116 can be smaller than would otherwise be necessary to achieve a selected capacitance between the respective stubs 114 and 116 and a ground plane 120. Likewise, the size of the transformer line section 112 can be made smaller. Notably, this allows for the area of the trace portions 102, 104 and 106 of the respective stubs and the transformer line section to be smaller. Accordingly, this allows for the area of the substrate 110 incorporating the two port line to be smaller than the area that would be required on a conventional circuit board.

The propagation velocity of a signal traveling on a resonant line is proportional to $$\frac{1}{\sqrt{\mu_r \varepsilon_r}}.$$

Accordingly, increasing the permeability and/or permittivity in the second region (101, 103, or 105) decreases propagation velocity of the signal on the line 100, and thus the signal wavelength. Hence the one quarter wavelength (or any multiple thereof) of the line 100 can be reduced by increasing the permeability and/or permittivity. Accordingly, the area of the dielectric layer or substrate 110 incorporating the two port line can be smaller than the area required on a conventionally constructed circuit board.

The second region also can have a permittivity selected to achieve a particular capacitance for portions or all of the two port line 100. Further, the permeability can be selected to result in a particular inductance for two port line 100 as well. The permittivity and permeability can be chosen to result in a desired $Z_0$ or other filter characteristics for the two port line 100. $Z_0$ can be selected to achieve a desired Q for particular resonances on the resonant line portions of the two port line, shape the resonant response of the filter, and/or adjust voltage maxima and minima. Further, $Z_0$ can be selected to suppress higher order resonant modes and/or to create a mismatch between the impedance of the two port line 100 and the impedance of free space. This impedance mismatch can help to minimize RF radiation from the two port line 100 and reduce electromagnetic interference (EMI).

The resonant characteristics of the two port line 100 can be distributed through the first and second regions of the substrate as the electric fields and magnetic fields formed in these regions store and release energy. The amount of energy stored and released by the fields can be adjusted by controlling permittivities and permeabilities associated with different regions in the dielectric layer. For example, a higher permittivity in a particular region will result in greater energy stored in the electric fields formed in that region. Likewise, higher permeability in a particular region will result in greater energy stored in the magnetic fields formed in that region.

Because the size of the stubs 114 and 116 can generally be smaller than a stub on a conventional circuit board, the Q of the capacitance can be more easily adjusted to optimize filter frequency response, i.e., voltage minimums and maximums at desired frequencies of the two port line 100. Further, frequency regions where the resonant line acts like an inductance or a capacitance can be more easily controlled as well. Hence, the present invention enables greater configurability of resonant lines in comparison to prior art.

Figure 4:
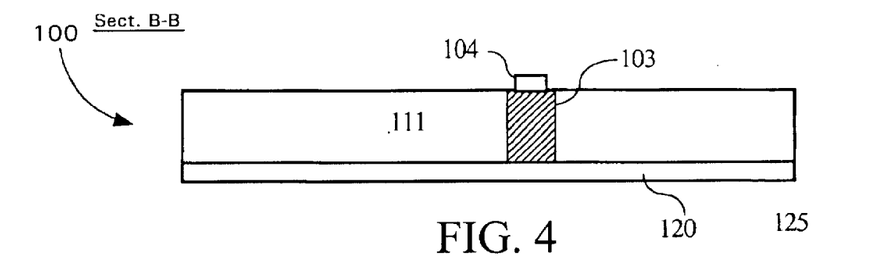
FIG. 4 is a cross-sectional view of an open-circuit stub configuration of the two port line of FIG. 1 taken along line B—B.
Figure 5:
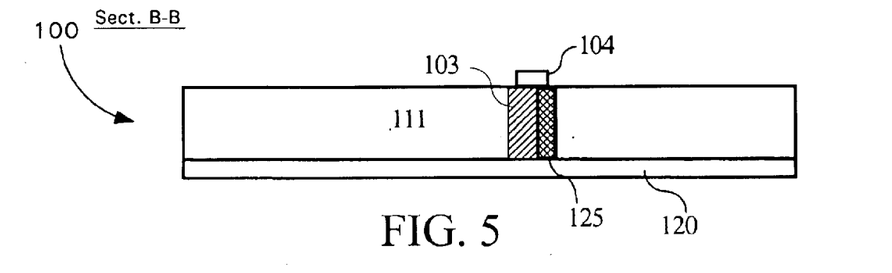
FIG. 5 is a cross-sectional view of a short circuit stub configuration of the two port line of FIG. 2 taken along line B—B.

FIG. 3 is a sectional view, shown along section line A—A and FIGS. 4 and 5 are section view shown along section line B—B of two different embodiments of the two port line 100 and substrate layer 110 of FIG. 1. In both embodiments shown, a ground plane 120 is provided beneath the two port line 102 and openings can be included for the passage of resonant line feeds. The two port line shown in FIG. 4 illustrates an open-circuited stub line whereas the two port line of FIG. 5 illustrates a short-circuited stub line with a shorting feed 125 provided to short the stub line (114, 104) to the ground plane 120. Similarly, but not shown, the stub 116 can also come in open-circuited and short-circuited configurations. As discussed in the background, a circuit designer can select either an open-circuited or short-circuited stub as part of the two port line, depending on the application, to provide the voltage and/or impedance characteristics desired from the two port line.

Figure 7:
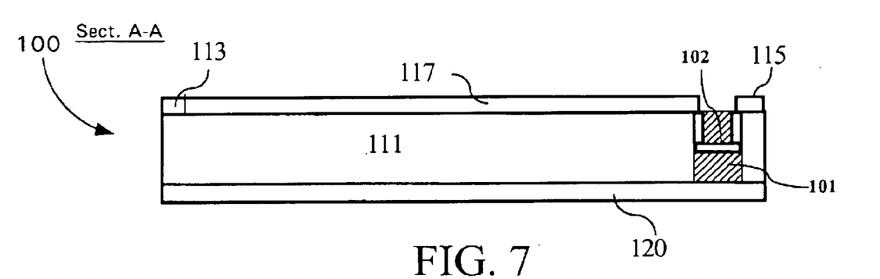
FIG. 7 is a cross-sectional view of an alternate embodiment of the two port line of FIG. 2 taken along line A—A where a transformer section is embedded.
Figure 8:
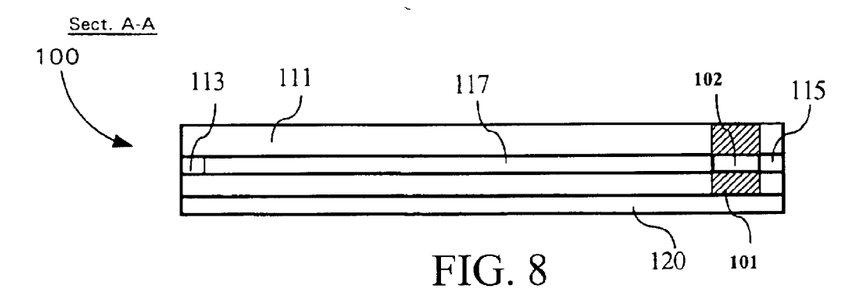
FIG. 8 is a cross-sectional view of another alternate embodiment of two port line in accordance with the present invention where the entire two filter line is embedded in the substrate.
Figure 9:
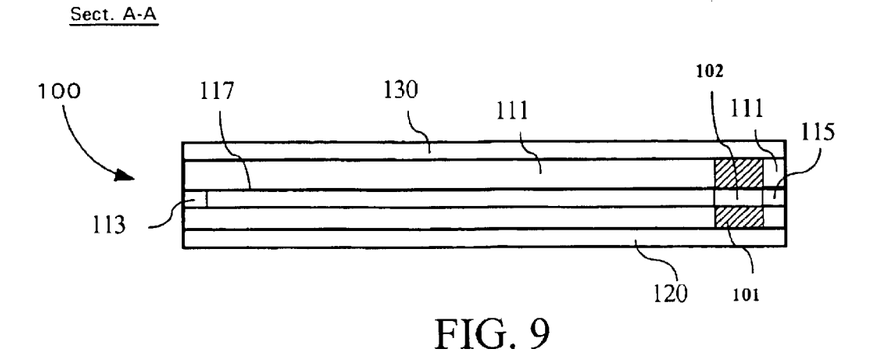
FIG. 9 is a cross-sectional view of another alternate embodiment of a two port line formed on a substrate in accordance with the present invention where the two port line is embedded in a stripline format.

Substrate layer 110 has a thickness that defines a resonant line height above ground. The thickness is approximately equal to the physical distance from two port line 100 to the underlying ground plane 116. This distance can be adjusted to achieve particular electrical geometries, for example, to increase or decrease capacitance when a certain substrate material is used. Referring to FIG. 7, another arrangement for the two port line 100 is shown wherein a stub, or in this instance, a transformer line section, is located within the second region 101 and positioned closer to the ground plane 120. This configuration can further increase the capacitance between the transformer line section and the ground plane 120 while maintaining a relatively low capacitance between trace 117 and the ground plane 120. In another arrangement, the entire two port line 100 can be contained within the substrate layer 100, as shown in FIG. 8. The resonant line 102 also can be contained below the substrate layer as well. This configuration can be particularly useful if the ground plane or ground traces are above the substrate layer. In yet another arrangement, the two port line 100 can be contained within the substrate layer and also within opposing ground planes 120 and 130 similar to a stripline configuration as shown in cross sectional view A—A of FIG. 9. By having its own individual ground plane or return trace (such as in a twin line arrangement), the two port line could be configured so that current on the ground plane or return trace flows in an opposite direction to current flowing in the two port line 100, thereby resulting in cancellation of magnetic flux associated with the resonant line portions of the two port line and lowering its inductance.

In one embodiment of the invention the permeability of the board substrate layer can be controlled by the addition of ferromagnetic, diamagnetic or paramagnetic material into the second region(s) to increase the inductance of the two port line. Preferably, the conductivity of the ferromagnetic material is low so as to not short circuit the stubs or transformer line section to any other lines in or on the substrate layer 110 or to the ground plane 120.

It should be noted that the two port line 100 configurations are not limited to the exemplary figures shown. For example, the two port line can have varying shapes and can be positioned to have varying distances between the two port lines and the ground plane or circuit layer surface. Further, any number of dielectric, ferromagnetic, diamagnetic and/or paramagnetic materials can be incorporated into any regions of the substrate 110. In one embodiment, $Z_0$ can be controlled over the entire length of two port line 100, or any part thereof, using multiple dielectric and ferromagnetic mixtures or concentrations to vary $Z_0$ over different regions of the line. For example, $Z_0$ can be controlled to minimize radiation of RF energy or electromagnetic interference (EMI) from the two port line 100. Further, the permittivity and permeability can be differentially modified at selected portions of the substrate layer to optimize resonant line performance. In yet another arrangement all substrate layer portions can be modified by differentially modifying the permittivity and permeability in all regions of the substrate layer.

The term "differential modifying" as used herein refers to any modifications, including additions, to the substrate layer 110 that result in at least one of the dielectric and magnetic properties being different at one portion of the substrate as compared to another portion. For example, the modification can be selective modification where certain substrate layer portions are modified to produce a first set of dielectric or magnetic properties, while other dielectric layer portions are left un-modified having dielectric and magnetic properties different from the first set of properties resulting from the modification.

Figure 10:
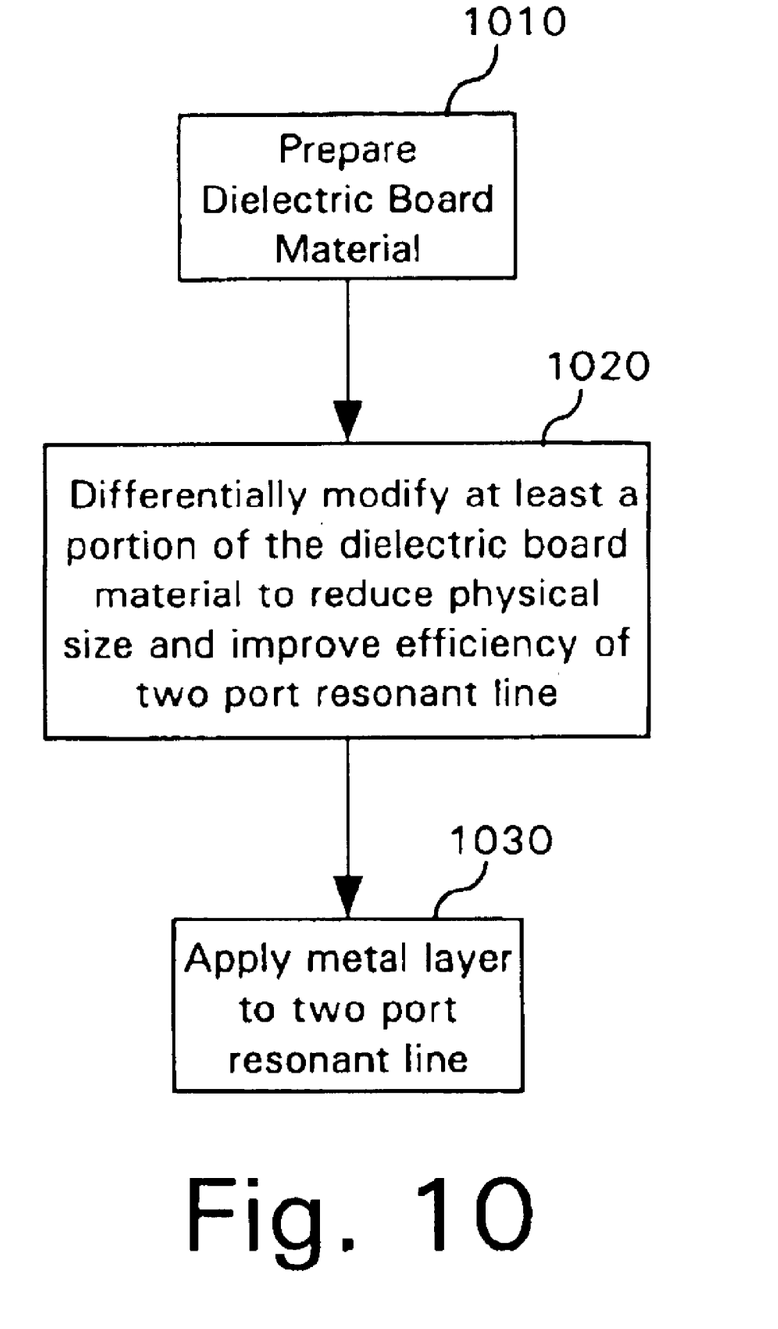
FIG. 10 is a flow chart that is useful for illustrating a process for manufacturing a resonant line of reduced physical size in accordance with the present invention.

An embodiment of the method for providing a size and performance optimized resonant line is described with reference to the text below and the flow chart presented in FIG. 10. Referring to FIG. 10, in step 1010, board substrate material is prepared for modification. The board material can include commercially available off the shelf board material, such as RT/duroid® 6002, or customized board material formed from a polymer material, or some combination thereof. The preparation process can be made dependent upon the type of board material selected.

In step 1020, one or more substrate layer portions such as the first region 111 or second region 101 is differentially modified so that the permittivity or permeability in the second portion 101 is different as compared to permittvity or permeability of the first region 111. In step 1030, a metal layer is applied to form the two port line. In step 1020, differential modification can be accomplished in several different ways.

According to one embodiment, a supplemental substrate layer can be added to existing substrate layer 110. Techniques known in the art such as various spray technologies, spin-on technologies, various deposition technologies or sputtering can be used to apply the supplemental layer. The supplemental layer can be selectively added in the region 112 or 114, or over the entire existing dielectric layer 110.

The differential modifying step 1020 can further include adding additional material to the substrate layer 110. The addition of material can be used to further control permittivity or permeability of the substrate layer 110 to improve resonant line efficiency or achieve a specific resonant line size.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
   a substrate including at least one dielectric layer having a first set of substrate properties in a first region of said dielectric layer, and at least a second set of substrate properties in a second region of said dielectric layer, said second set of substrate properties different than said first set of substrate properties;
   at least one ground coupled to said substrate; and,
   a two port resonant line disposed on said substrate, at least a portion of said two port resonant un coupled to said second region.

2. A circuit for processing radio frequency signals, comprising:
   a substrate where said circuit can be placed, said substrate including at least one dielectric layer, said dielectric layer having a first set of substrate properties over a first region, and at least a second set of substrate properties over a second region, said second set of substrate properties being different than said first set of substrate properties;
   at least one around coupled to said substrate;
   a two port resonant line, at least a portion of said two port resonant line coupled to said second region;
   wherein the two port resonant line is a lowpass filter, said lowpass filter including a transformer line section on at least a portion of said first region and at least on a portion of said second region and at least a first stub section on said first region and at least on portion of said second region.

3. A circuit can be placed, said substrate including at least one signals comprising:
   a substrate where said circuit can be placed, said substrate including at least one dielectric layer, said dielectric layer having a first set of substrate properties over a first region, and at least a second set of substrate properties over a second region, said second set of substrate properties being different than said first set of substrate properties;
   at least one ground coupled to said substrate;
   a two port resonant line, at least a portion of said two port resonant line coupled to said second region;
   wherein the two port resonant line is a lowpass filter including a transformer line on at least the second region and including at least a first stub section on at least the second region.

4. A circuit for processing radio frequency signals, comprising:
   a substrate where said circuit can be placed, said substrate including at least one dielectric layer, aid dielectric layer having a first set of substrate properties over a first region, and at least a second set of substrate properties over a second region, said second set of substrate properties being different than said first set of substrate properties;
   at least one ground coupled to said substrate;
   a two port resonant line at least a portion of said two port resonant line coupled to said second region;
   wherein the two port resonant line is a lowpass filter including a transformer line coupled to at least the second region and including at least a first stub section coupled to a third region.

5. The circuit of claim 4, wherein the second set of substrate properties of at least the second region of the transformer line are different from the substrate properties of the third region coupled to the first stub.

6. The circuit of claim 2 wherein at least one of said first set of substrate material properties and said second set of substrate properties is controlled to reduce a size of said low ass filter.

7. The circuit of claim 2 wherein at least one of said first set of substrate properties and said second set of substrate properties is controlled to adjust a position of at least one of a voltage maxima and a voltage minima measured on said low pass filter.

8. The circuit of claim 2 wherein at least one of said first set of substrate properties and said second set of substrate properties is controlled to adjust an amplitude of at least one of a voltage maxima and a voltage minima measured on said low pass filter.

9. The circuit of claim 2 wherein at least one at said first set of substrate properties and said second set of substrate properties is controlled to adjust an impedance on said low pass filter.

10. A circuit for processing radio frequency signals, comprising:

a substrate where said circuit can be placed, said substrate including at least one dielectric layer, said dielectric layer having a first set of substrate properties over a first region, and at least a second set of substrate properties over a second region, said second set of substrate properties being different than said first set of substrate properties;

at least one ground coupled to said substrate a two part resonant line, at least a portion of said two port resonant line coupled to said second region;

wherein at least one of said first set of substrate properties and said second set of substrate properties is controlled to adjust a capacitance between said low pass filter and another metallic structure.

11. The circuit of claim 1, wherein at least one of said first set of substrate properties and aid second set of substrate properties is controlled to adjust the quality factor of said lowpass filter.

12. A circuit for processing radio frequency signals, comprising:

a substrate where said circuit can be placed, said substrate including at least one dielectric layer, having a first set of substrate properties over a first region, and at least a second set of substrate properties over a second region, said second set of substrate properties being different than said first set of substrate properties;

at least one ground coupled to said substrate;

a two port resonant line, at least a portion of said two port resonant line coupled to said second region;

wherein at least the first stub section comprises a plurality of stub sections and each of the plurality of stub sections are coupled to their own respective substrate regions having their respective substrate characteristics.

13. The circuit of claim 1, wherein the circuit forms a lowpass filter with a deeper rejection in a bandstop area of a filter response and a lower loss in a bandpass area of the filter response than possible with conventional substrate materials.

14. The circuit of claim 1, wherein the first set of substrate properties and the second set substrate properties are properties selected from the group comprising permeability and permittivity.

15. A printed circuit for processing radio frequency signals, comprising:

a substrate upon which said circuit can be placed, said substrate including at least one dielectric layer, said dielectric layer having a first set of substrate properties over a first region, and at least a second set of substrate material properties over a second region, aid second set of substrate material properties providing a different dielectric permittivity and magnetic permeability as compared to said first set of dielectric properties;

at least one ground disposed on said substrate; and, a lowpass filter, said lowpass filter including a transformer line section on at least a portion of said first region and on at least a portion of said second region and at least a first stub section on said first region and on at least a portion of said second region.

16. The circuit of claim 15 wherein at least one of said first set of substrate material properties and said second set of substrate material properties is controlled to reduce a size of said lowpass filter.

17. The circuit of claim 15 wherein at least one of said first set of substrate material properties and said second set of substrate material properties is controlled to adjust a position of at least one of a voltage maxima and a voltage minima measured on said lowpass filter.

18. The circuit of claim 15 wherein at least one of said first set of substrate material properties and said second set of substrate material properties is controlled to adjust an impedance on said lowpass filter.

19. The circuit of claim 15 wherein at least one of said first set of substrate material properties and said second set of substrate material properties is controlled to adjust a capacitance between said lowpass filter and another metallic structure.

20. The circuit of claim 15 wherein at least one of said first set of substrate material properties and said second set of substrate material properties is controlled to adjust the quality factor of said lowpass filter.

21. A printed circuit for processing radio frequency signals, comprising:

a substrate including substrate regions upon which said circuit can be placed, wherein said circuit it is a lowpass filter, said lowpass filter including a transformer line section, at least first stub section, and transmission line sections interconnecting the transformer line section with at least the first stub section; and at least one ground coupled to said substrate, wherein the transformer line section, the at least first stub section and the transmission line sections are coupled to respective substrate regions that have substrate characteristics that are each independently customizable.

22. The printed circuit of claim 21, wherein the substrate characteristics that are each independently customizable are selected from the group comprising dielectric permittivity and magnetic permeability.

* * * * *

UNITED STATES PATENT AND TRADEMARK OFFICE
CERTIFICATE OF CORRECTION

PATENT NO. : 6,794,952 B2
DATED : September 21, 2004
INVENTOR(S) : Killen et al.

It is certified that error appears in the above-identified patent and that said Letters Patent is hereby corrected as shown below:

Column 13,
Line 65, delete "un" and replace with -- line --.

Column 14,
Line 8, delete "around" and replace with -- ground --.
Line 17, delete "can be placed, said substrate including at least one" and replace with -- for processing radio frequency --.
Line 18, insert "," after "signals".
Line 36, delete "aid" and replace with -- said --.
Line 57, delete "ass" and replace with -- pass --.

Column 15,
Line 1, delete "at" after "one" and replace with -- of --.
Line 22, delete "aid" and replace -- said --.
Line 28, insert -- said dielectric layer -- before "having".
Line 48, insert -- of -- after "set".

Column 16,
Line 3, delete "aid" and replace with -- said --.
Line 38, delete "it".

Signed and Sealed this

Twenty-third Day of August, 2005

JON W. DUDAS
*Director of the United States Patent and Trademark Office*